United States Patent
Lai et al.

(10) Patent No.: US 11,011,618 B2
(45) Date of Patent: May 18, 2021

(54) CIRCUIT DEVICES WITH GATE SEALS

(71) Applicant: Taiwan Semiconductor Manufacturing Co., Ltd., Hsinchu (TW)

(72) Inventors: Sheng-Chou Lai, Hsinchu (TW); Tsung-Yu Chiang, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 65 days.

(21) Appl. No.: 16/124,451

(22) Filed: Sep. 7, 2018

(65) Prior Publication Data

US 2019/0165125 A1    May 30, 2019

Related U.S. Application Data

(60) Provisional application No. 62/592,571, filed on Nov. 30, 2017.

(51) Int. Cl.

| | |
|---|---|
| *H01L 29/66* | (2006.01) |
| *H01L 21/02* | (2006.01) |
| *H01L 29/49* | (2006.01) |
| *H01L 29/78* | (2006.01) |
| H01L 21/321 | (2006.01) |

(52) U.S. Cl.
CPC .... *H01L 29/6656* (2013.01); *H01L 21/02164* (2013.01); *H01L 21/02238* (2013.01); *H01L 21/02255* (2013.01); *H01L 29/4983* (2013.01); *H01L 29/66545* (2013.01); *H01L 29/66795* (2013.01); *H01L 29/785* (2013.01); *H01L 21/32105* (2013.01)

(58) Field of Classification Search
CPC .......... H01L 29/66545; H01L 29/6656; H01L 21/02164
See application file for complete search history.

(56) References Cited

U.S. PATENT DOCUMENTS

| | | | |
|---|---|---|---|
| 6,465,334 B1 * | 10/2002 | Buynoski | H01L 21/28194 |
| | | | 438/591 |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |

(Continued)

FOREIGN PATENT DOCUMENTS

| | | |
|---|---|---|
| CN | 102770960 A | 11/2012 |
| CN | 105742344 A | 7/2016 |

(Continued)

*Primary Examiner* — Dale E Page
*Assistant Examiner* — Wilner Jean Baptiste
(74) *Attorney, Agent, or Firm* — Haynes and Boone, LLP

(57) ABSTRACT

Various examples of a circuit device that includes gate stacks and gate seals are disclosed herein. In an example, a substrate is received that has a fin extending from the substrate. A placeholder gate is formed on the fin, and first and second gate seals are formed on sides of the placeholder gate. The placeholder gate is selectively removed to form a recess between side surfaces of the first gate seal and the second gate seal. A functional gate is formed within the recess and between the side surfaces of the first gate seal and the second gate seal.

20 Claims, 16 Drawing Sheets

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2012/0292708 A1 | 11/2012 | Chen et al. |
| 2013/0248951 A1 | 9/2013 | Huang |
| 2014/0370696 A1 | 12/2014 | Tu et al. |
| 2015/0236159 A1* | 8/2015 | He ............... H01L 21/02274 257/401 |
| 2016/0163861 A1* | 6/2016 | Park ............ H01L 21/823468 257/192 |
| 2016/0190280 A1 | 6/2016 | Young et al. |
| 2016/0358921 A1* | 12/2016 | Park ............ H01L 21/823842 |

FOREIGN PATENT DOCUMENTS

| | | |
|---|---|---|
| KR | 20120130315 | 11/2012 |
| KR | 20160078218 A | 7/2016 |
| KR | 20170046093 | 4/2017 |
| KR | 20170051120 A | 5/2017 |
| TW | 201222678 | 6/2012 |
| TW | 201639012 | 11/2016 |
| TW | 201738931 | 11/2017 |

\* cited by examiner

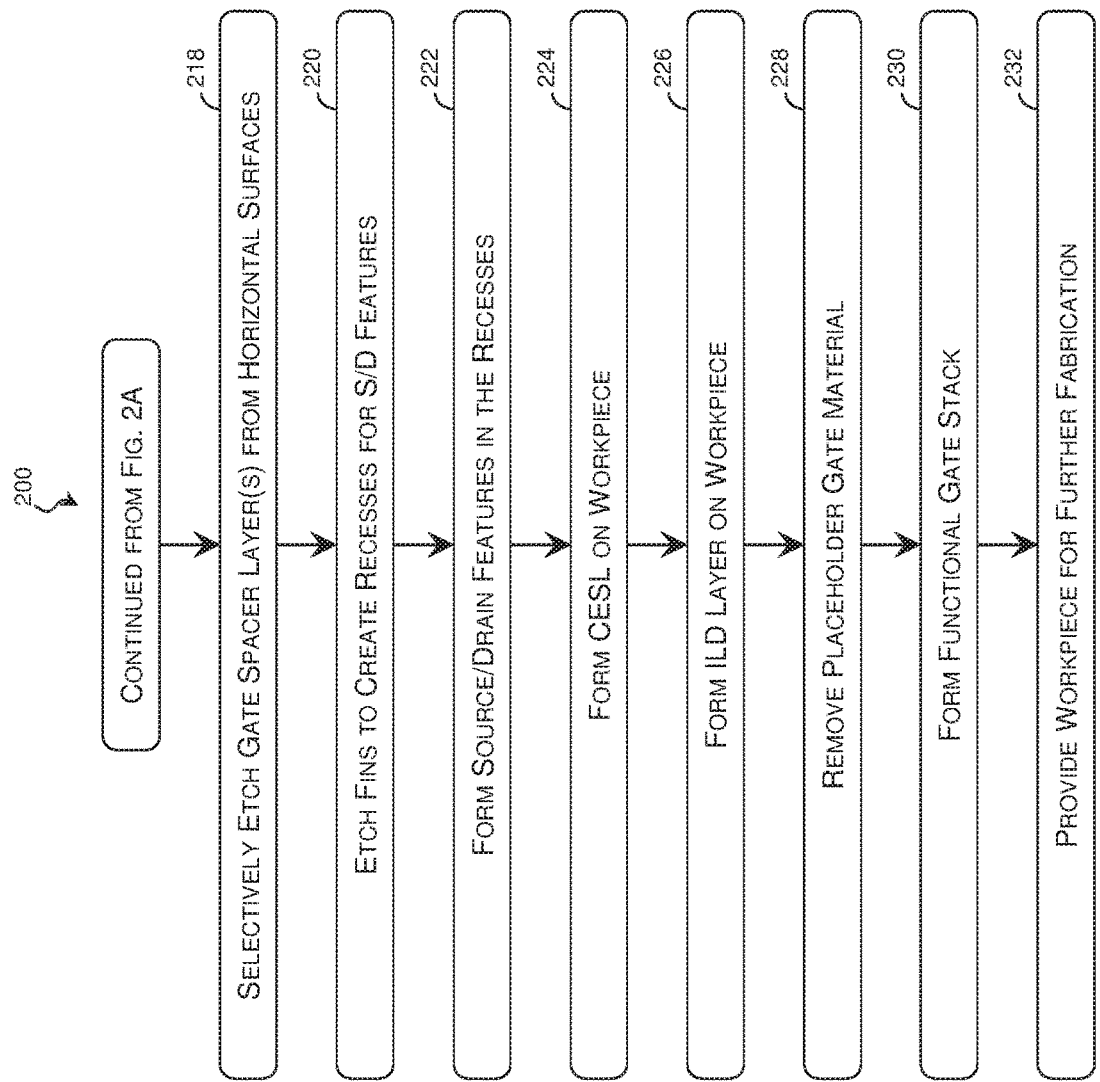

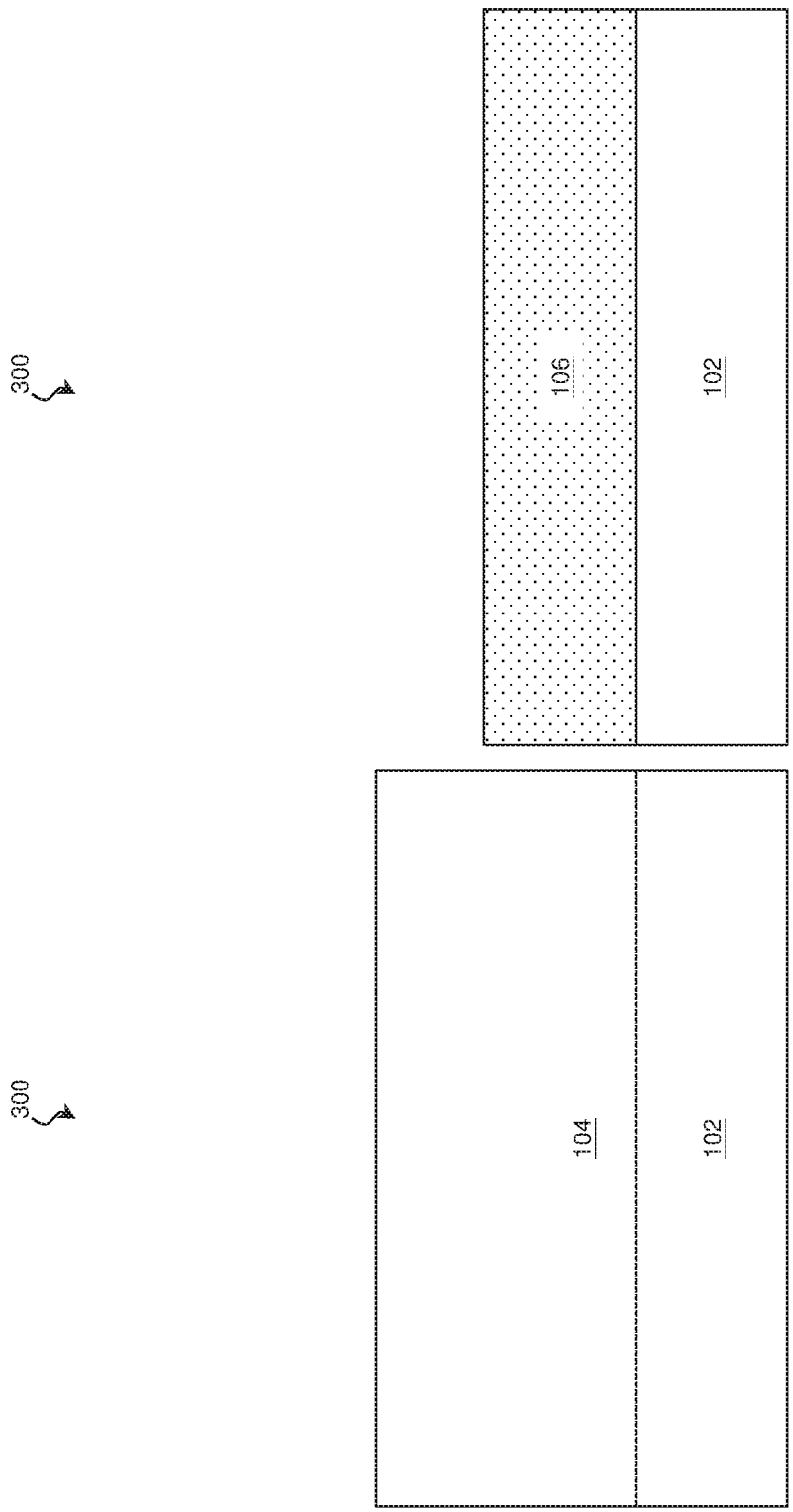

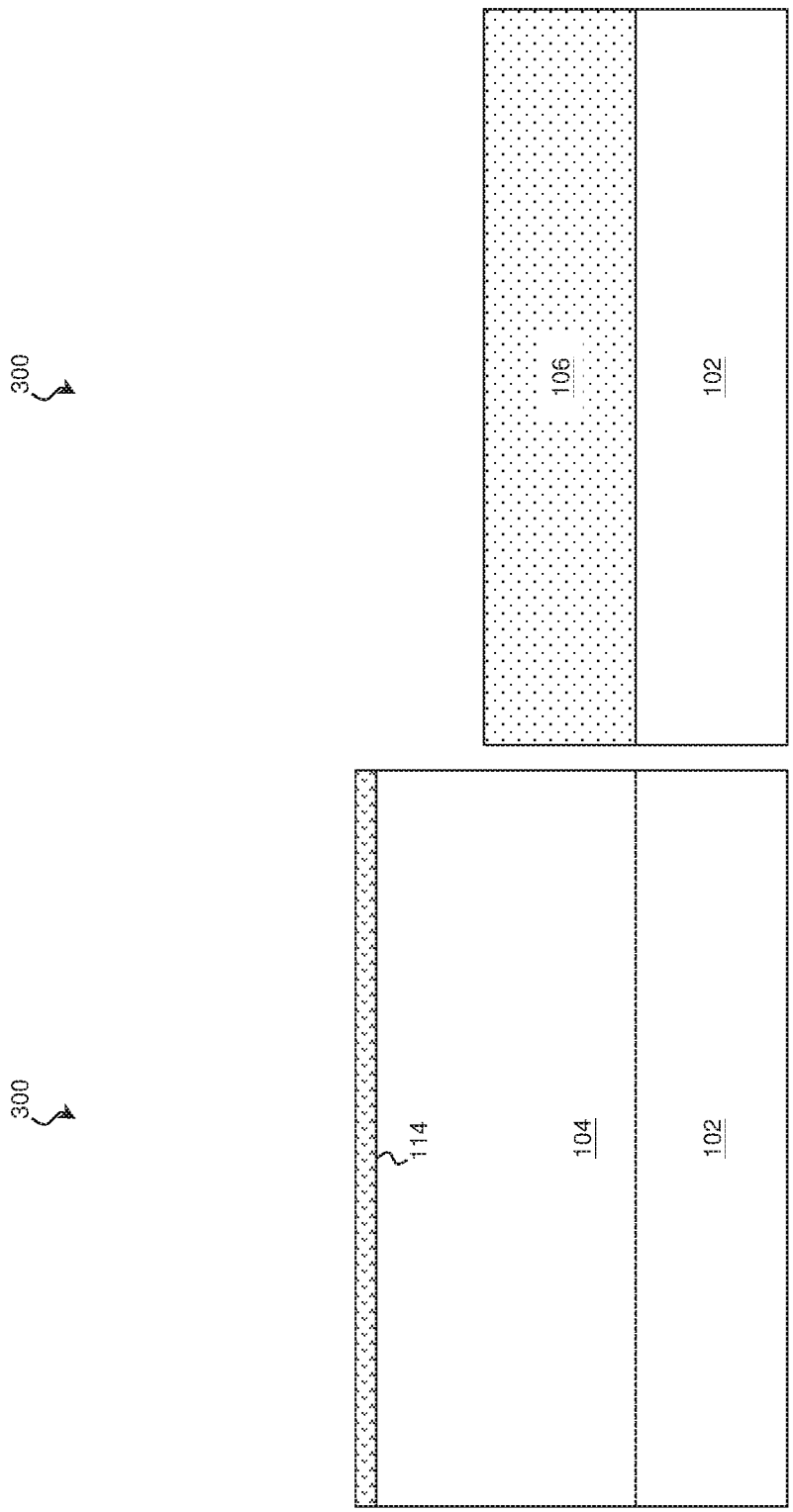

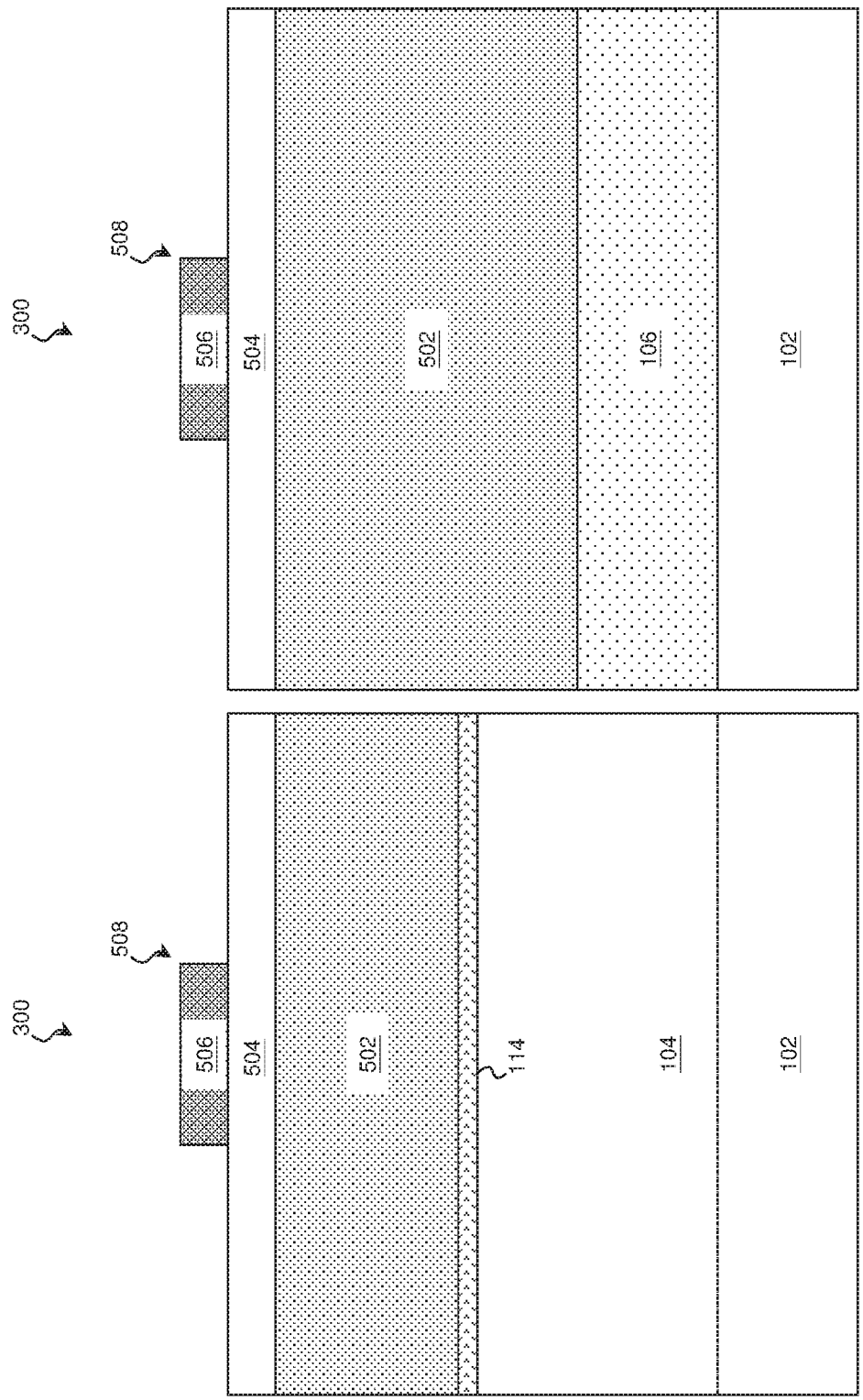

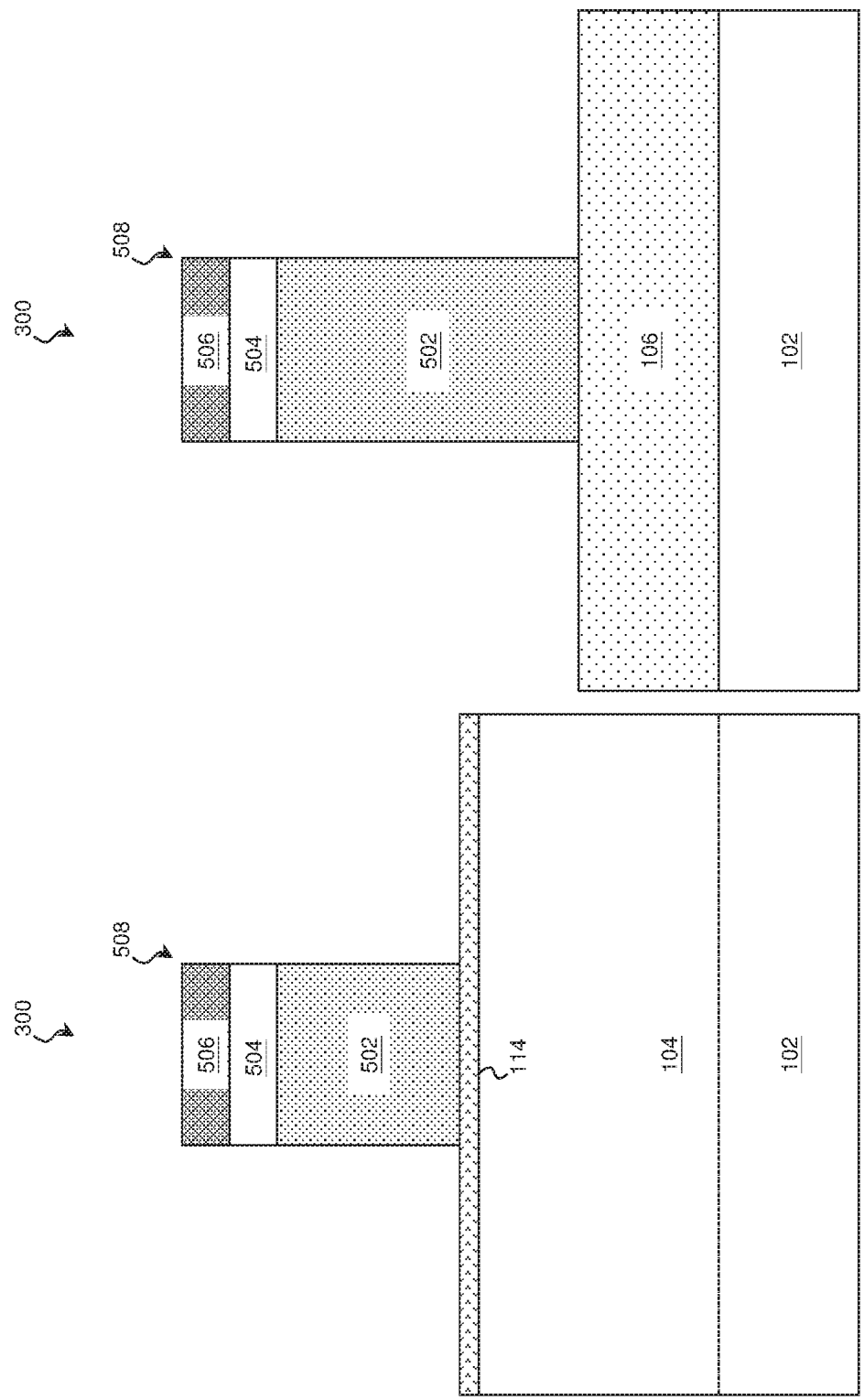

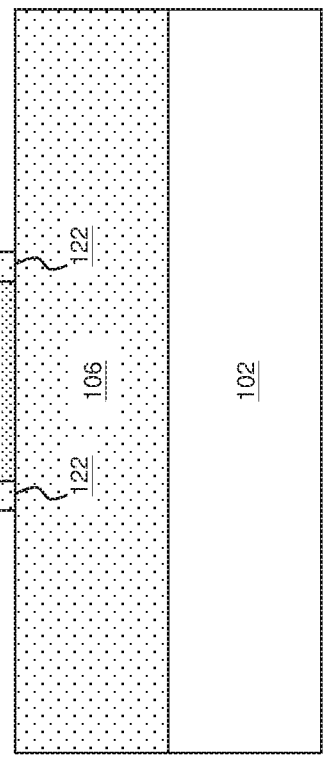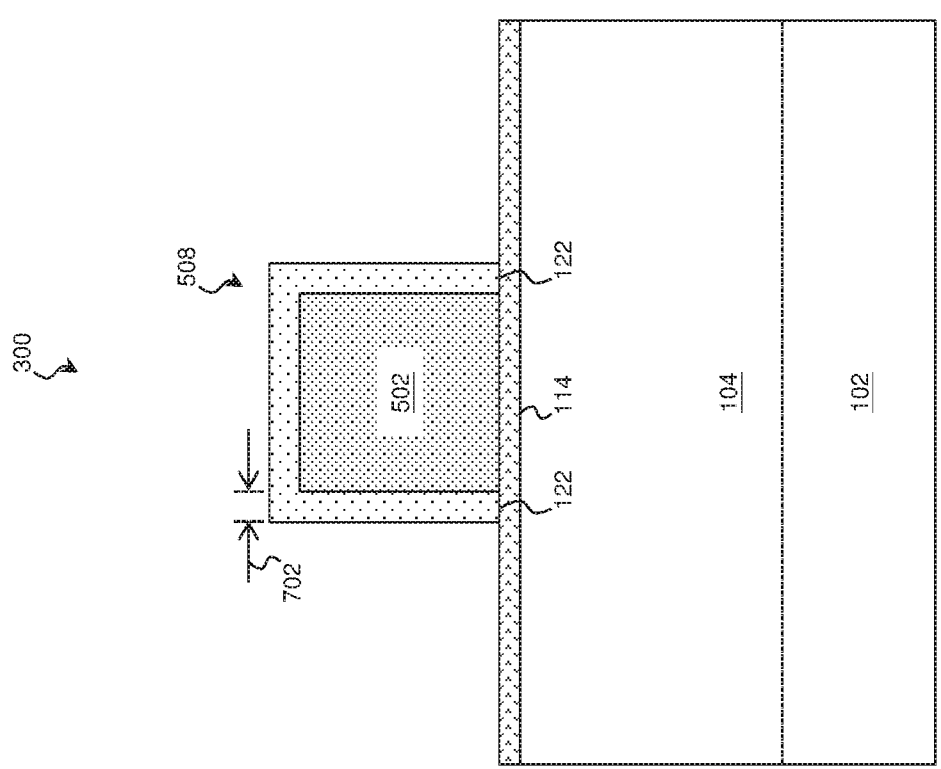

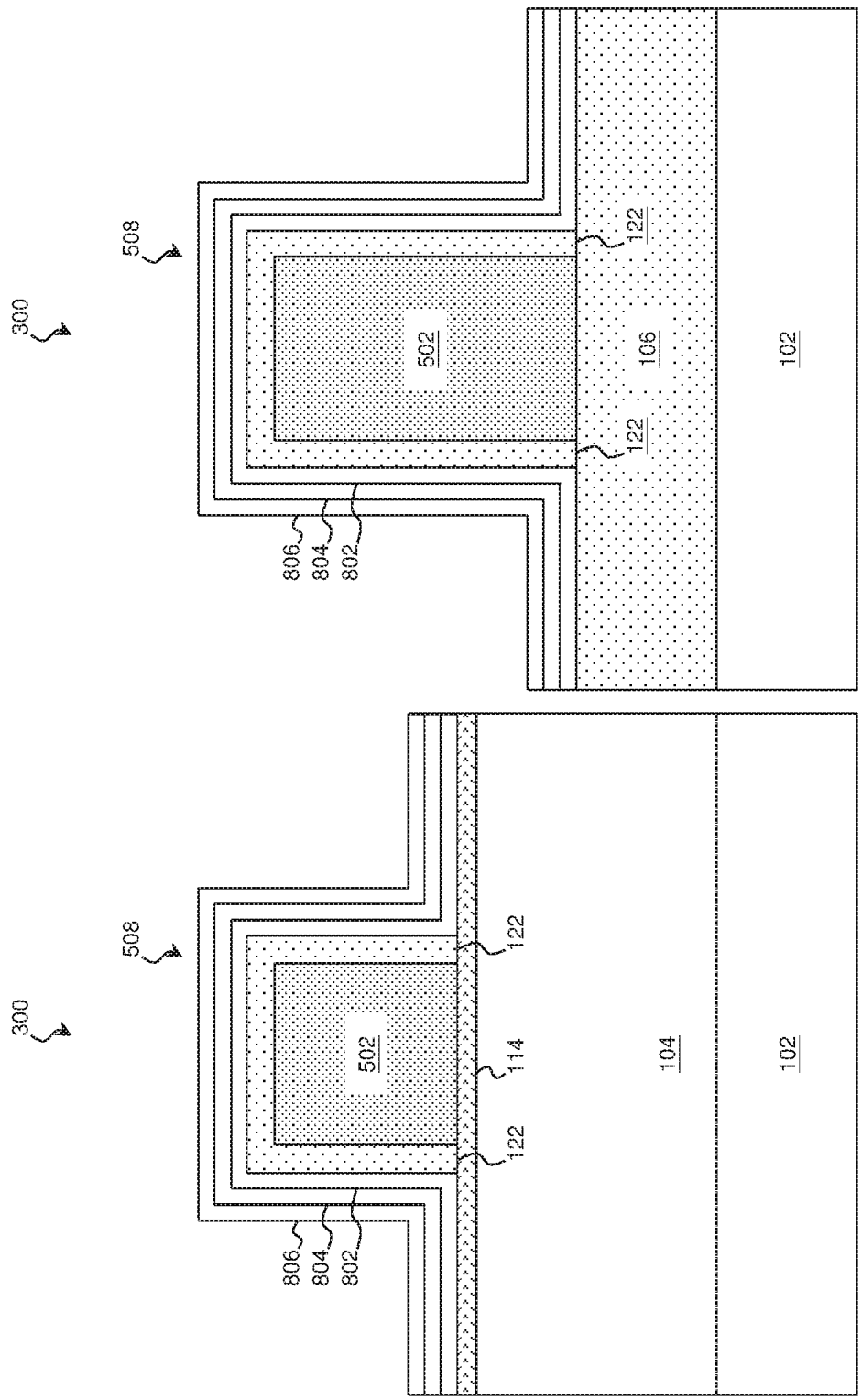

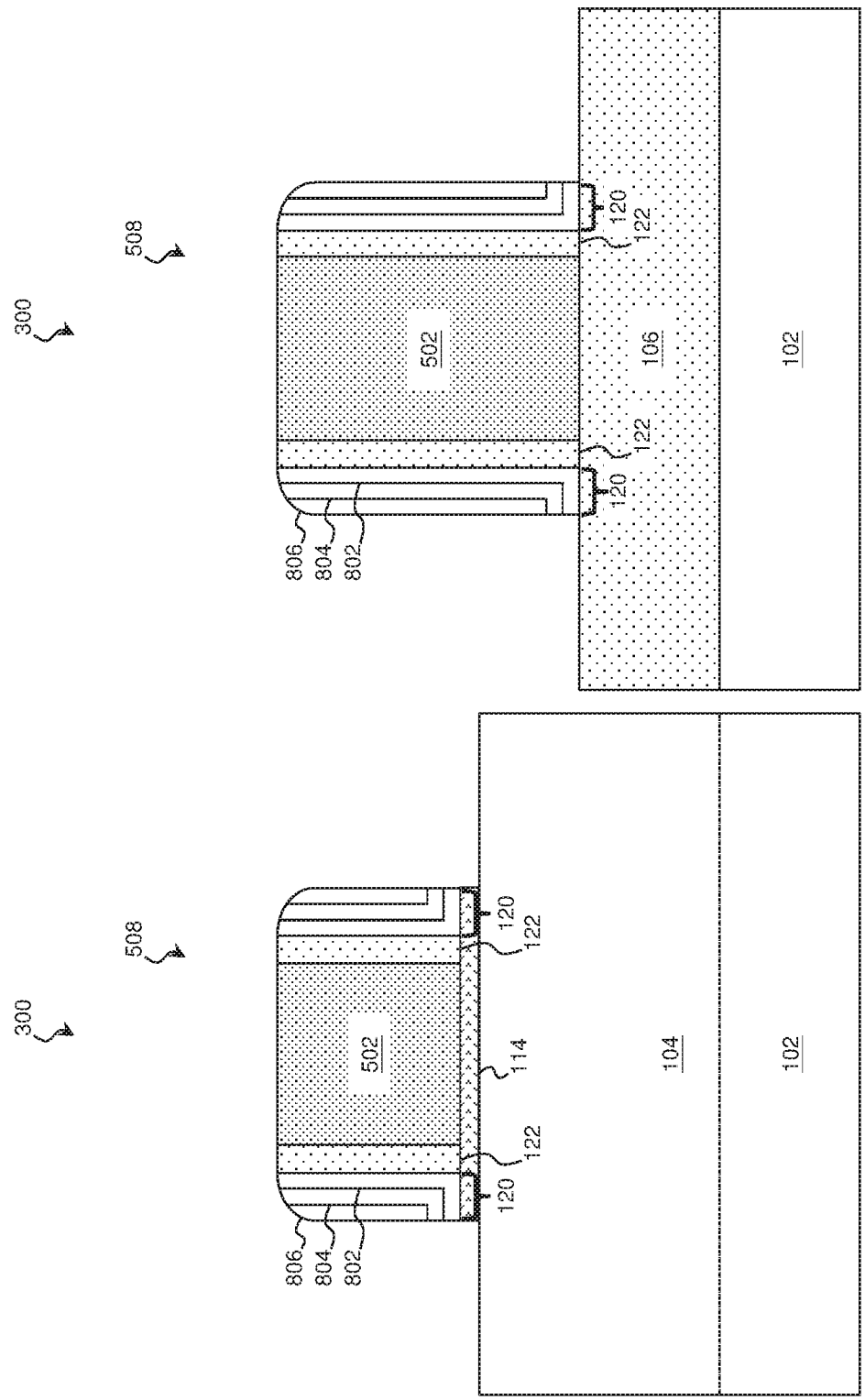

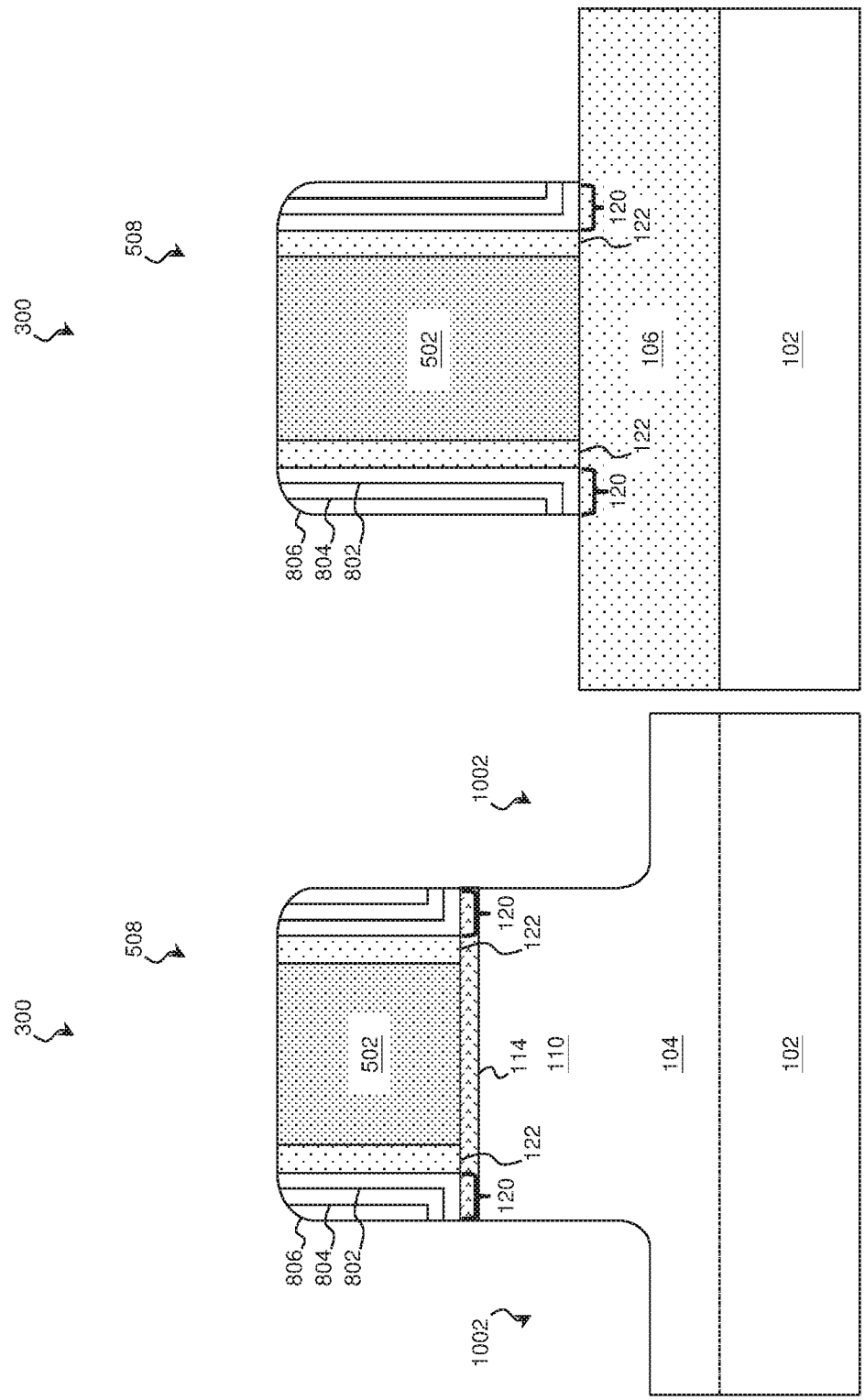

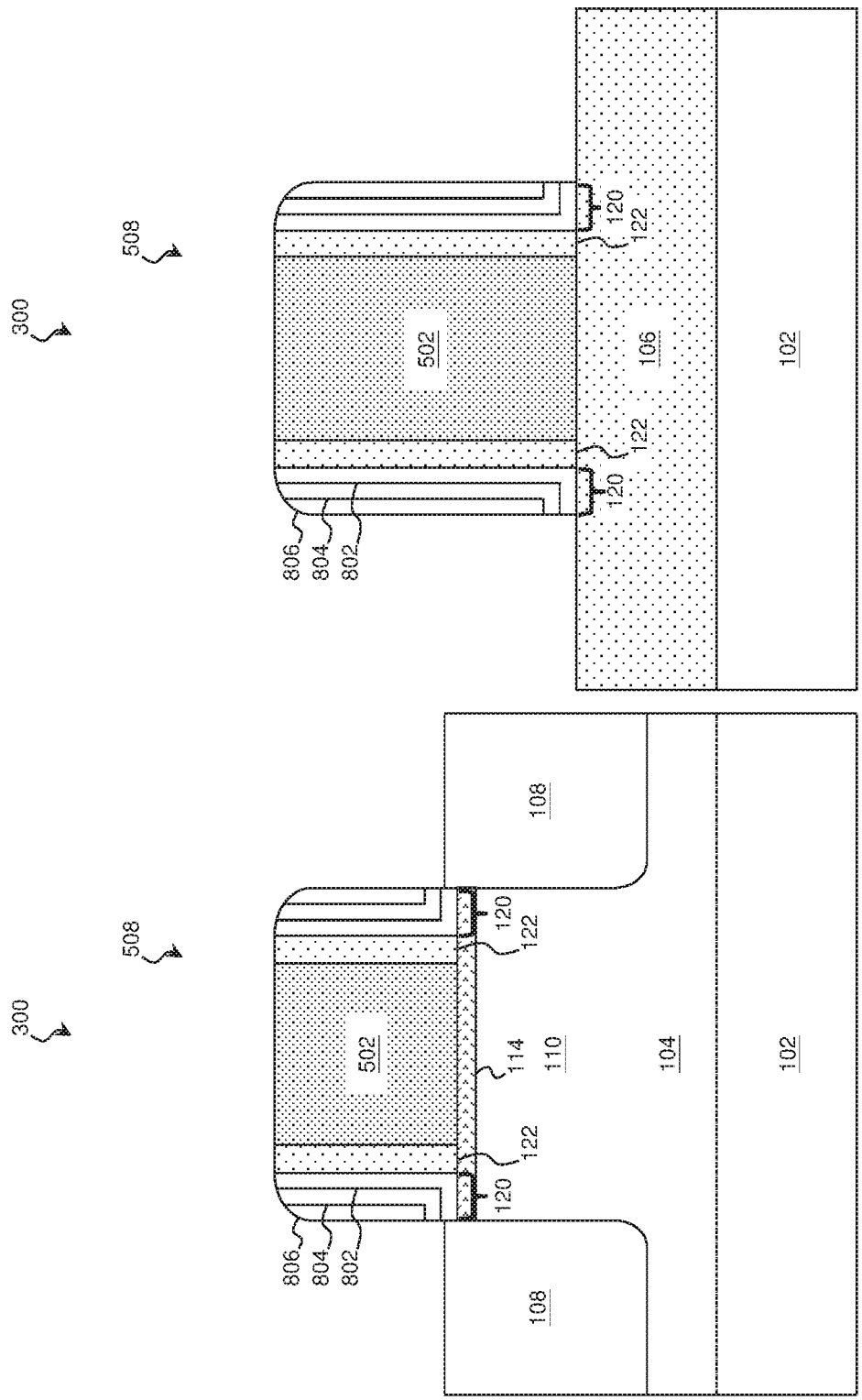

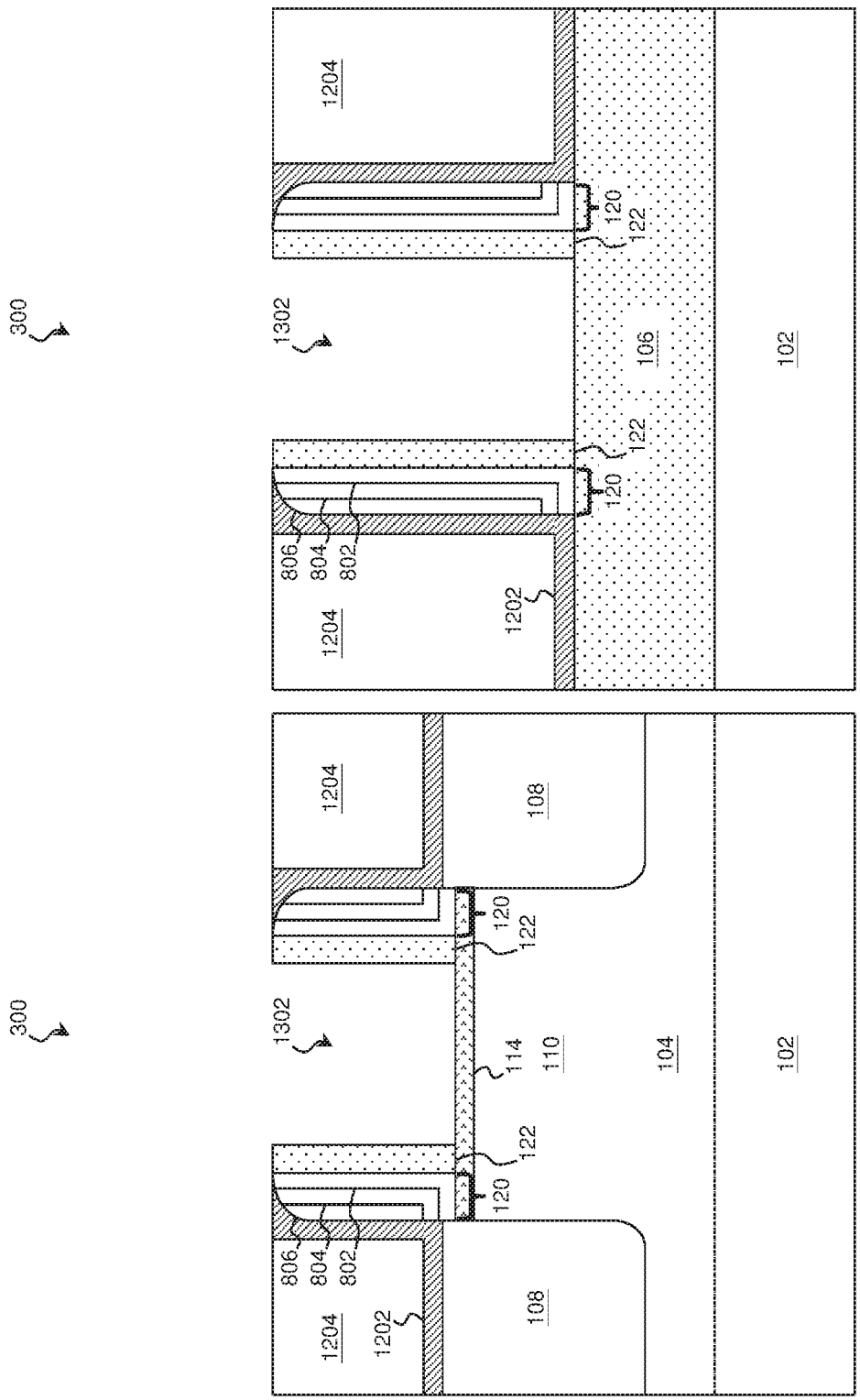

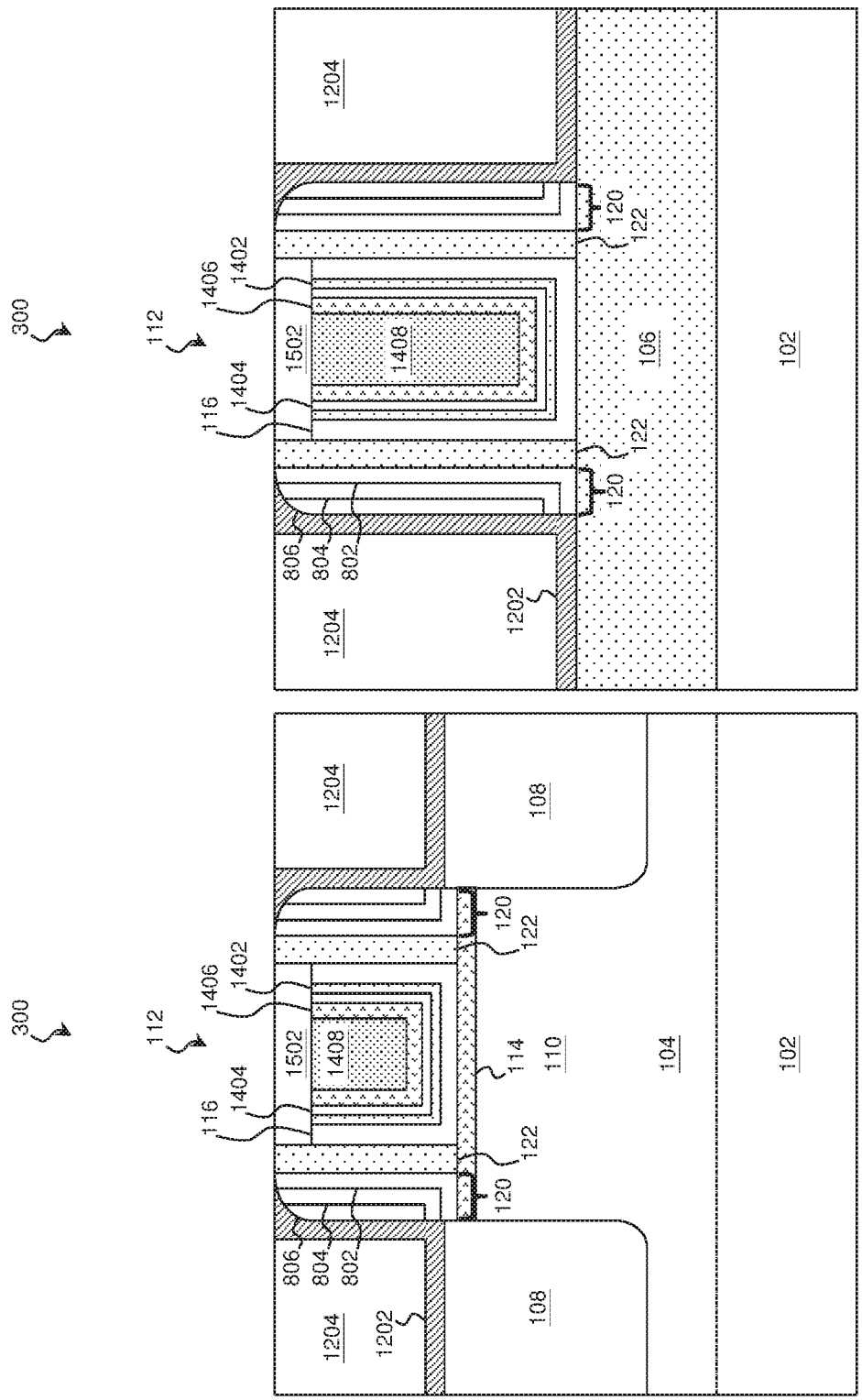

CIRCUIT DEVICES WITH GATE SEALS

PRIORITY DATA

The present application claims the benefit of U.S. Provisional Application No. 62/592,571, entitled "Circuit Devices with Gate Seals," filed Nov. 30, 2017, herein incorporated by reference in its entirety.

BACKGROUND

The semiconductor industry has progressed into nanometer technology process nodes in pursuit of higher device density, higher performance, and lower cost. Beyond merely shrinking devices, circuit designers are looking to novel structures to deliver even greater performance. One avenue of inquiry is the development of three-dimensional designs, such as fin-like field effect transistors (FinFETs). A FinFET may be envisioned as a typical planar device extruded out of a substrate and into the gate. An exemplary FinFET is fabricated with a thin "fin" (or fin structure) extending up from a substrate. The channel region of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow. In other words, they may be faster, smaller, and more efficient than planar devices.

As a further example, developments have been made to the gate structures of transistors in integrated circuits. At a high level, a gate structure may include a conductor and a gate dielectric that separates the conductor from a channel region of the transistor. With respect to the gate conductor, developments now allow the use of layers of metal as a substitute for polysilicon in the gate conductor. Accordingly, whereas polysilicon once replaced metal as a gate conductor because of polysilicon's increased resistance to heat and ease of fabrication, metal is once again replacing polysilicon in part because of metal's higher conductance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A and 2B are flow diagrams of a method of fabricating a workpiece according to some embodiments of the present disclosure.

FIGS. 3A, 4A, 5A, 6A, 7A, 8A, 9A, 10A, 11A, 12A, 13A, 14A, and 15A are cross-sectional view diagrams of the workpiece taken through a fin at various stages of a method of fabricating a workpiece with a gate seal according to some embodiments of the present disclosure.

FIGS. 3B, 4B, 5B, 6B, 7B, 8B, 9B, 10B, 11B, 12B, 13B, 14B, and 15B are cross-sectional view diagrams of the workpiece taken through a non-fin region at various stages of a method of fabricating a workpiece with a gate seal according to some embodiments of the present disclosure.

DETAILED DESCRIPTION

Figure 1:
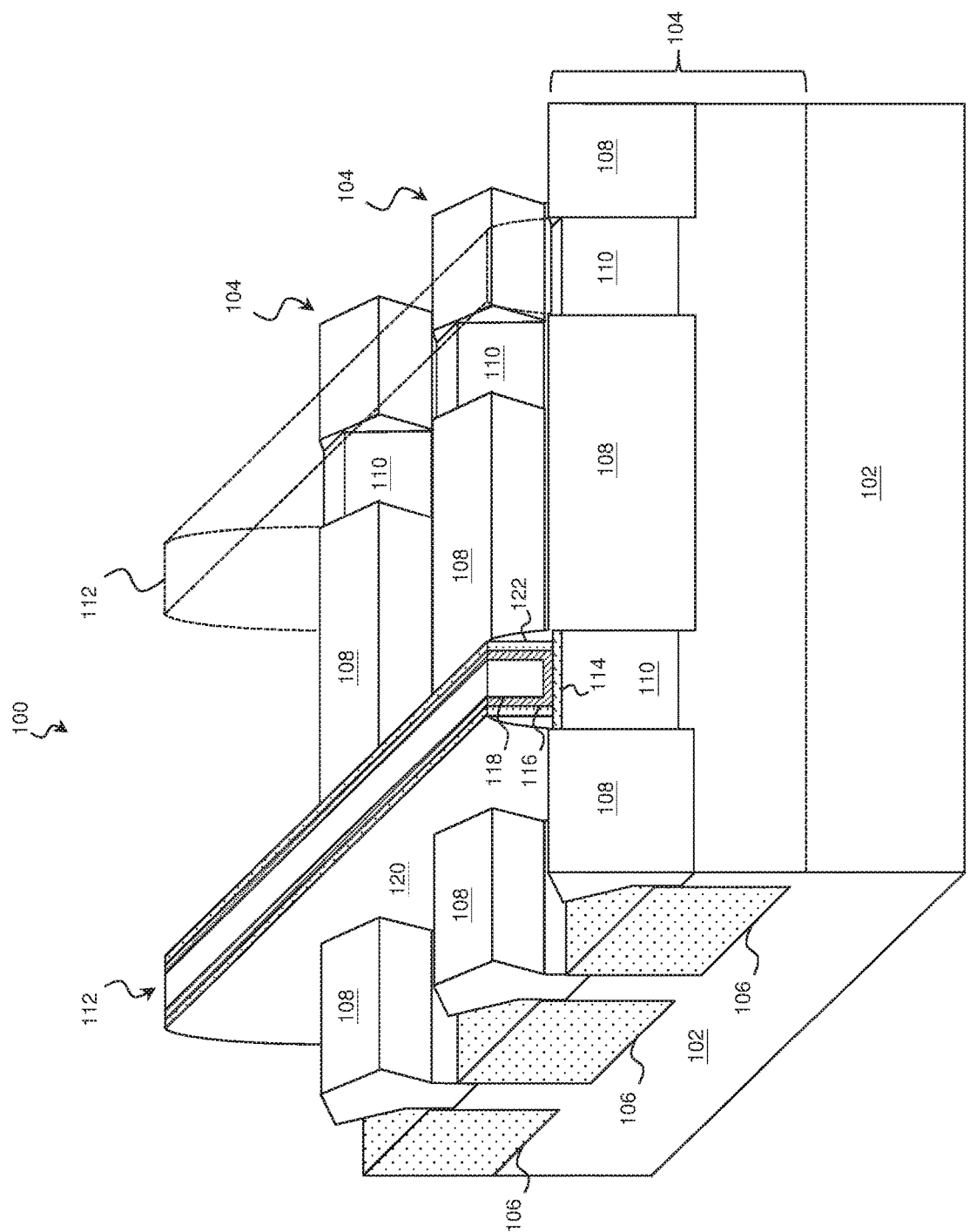
FIG. 1 is a perspective view of a portion of a workpiece according to some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

As device sizes continue to fall, raised features present an increasing challenge to fabrication. For example, as the name implies, FinFETs are transistors where the gate wraps around a raised fin. As fins narrow and the gaps between fins become smaller, it may prove difficult to reliably fabricate the gates surrounding the fins, particularly in, but not limited to, the trenches between fins. In a gate replacement process where a temporary placeholder gate is formed and later replaced with a metal-containing functional gate, defects such as metal gate extrusion may occur in the trenches and elsewhere when the functional gate is formed.

To address this issue and others, some embodiments of the present disclosure provide a transistor with a gate seal to prevent extrusion and other defects. In one such embodiment, a placeholder gate is formed around the channel region of a fin. A gate seal is formed on the placeholder gate prior to forming a gate spacer around the placeholder gate. The gate seal provides a barrier around the placeholder gate, including in areas where the gate spacer may not be effectively and uniformly deposited such as the trenches between fins. When the placeholder gate is removed, the gate seal is left in place to provide an effective barrier against gate extrusion when forming the functional gate.

In some embodiments, because the gate seal is formed by a process that provides more uniform deposition within the trench than the deposition process used to form the gate spacer, the gate seal reduces defects. Furthermore, the gate seal may reduce the surface roughness of the placeholder gate and thereby provide a better surface for the gate spacer to adhere to. In turn, this may improve the uniformity of the gate spacer. Thus, some embodiments of the present disclosure reduce gate defects, particularly in trenches between fins, in order to improve yield. However, unless otherwise noted, no embodiment is required to provide any particular advantage.

FIG. 1 is a perspective view of a portion of a workpiece 100 according to some embodiments of the present disclosure. FIG. 1 has been simplified for the sake of clarity and to better illustrate the concepts of the present disclosure. Additional features may be incorporated into the workpiece 100, and some of the features described below may be replaced or eliminated for other embodiments of the workpiece 100.

The workpiece 100 includes a substrate 102 with one or more device fins 104 formed upon it and separated by isolation features 106. The device fins 104 are representative of any raised feature, and while the illustrated embodiments include FinFET device fins 104, further embodiments include other raised active and passive devices formed upon the substrate 102. In some embodiments, the FinFET device fins 104 include a pair of opposing source/drain features 108 separated by a channel region 110. The flow of carriers (electrons for an n-channel FinFET and holes for a p-channel FinFET) through the channel region 110 is controlled by a voltage applied to a gate stack 112 adjacent to and over-wrapping the channel region 110. One of the gate stacks 112 is shown as translucent to better illustrate the underlying channel region 110.

In the illustrated embodiment, the channel region 110 rises above the plane of the substrate 102 upon which it is formed and above the isolation features 106, and accordingly, circuit devices formed on the device fins 104 may be referred to as a "nonplanar" devices. The raised channel region 110 provides a larger surface area proximate to the gate stack 112 than comparable planar devices. This strengthens the electromagnetic field interactions between the gate stack 112 and the channel region 110, which may reduce leakage and short channel effects associated with smaller devices. Thus in many embodiments, FinFETs, and other nonplanar devices deliver better performance in a smaller footprint than their planar counterparts.

With respect to the gate stack 112, it may include an interfacial layer 114 where it meets the channel region, a gate dielectric 116, such as a high-K dielectric layer, disposed on the interfacial layer 114, and one or more metal-containing layers 118 disposed on the gate dielectric 116. In various embodiments, the metal-containing layers 118 include a capping layer, a work function layer, a barrier layer, and/or an electrode fill. Examples of these layers are shown and described in more detail below.

The gate stack 112 may be disposed between a pair of opposing gate spacers 120. The gate spacers 120 may be used to control the size of the channel region 110 by controlling where the source/drain features 108 are formed and may be used in the formation of the gate stack 112. In some embodiments, the workpiece 100 includes a gate seal 122 disposed between the gate spacers 120 and the gate stack 112. The gate seal 122 may extend vertically between a vertical side surface of the gate spacers 120 and a vertical side surface of a component of the gate stack 112, such as the gate dielectric 116.

The gate seal 122 may improve the fabrication of the workpiece 100 and specifically the gate stack 112. In some examples, the gate seal 122 is formed by a process that produces a more uniform shape, particularly between fins, than the deposition used for the gate spacers 120. This may prevent portions of the gate stack 112 from extruding through defects in a gate spacer interface. In some examples, the gate seal 122 reduces the surface roughness of a placeholder gate material that is subsequently replaced to form the gate stack 112. In so doing, the gate seal 122 may provide a better interface with the gate spacers 120 and may further prevent gate stack extrusion. Similarly, in some examples, the gate seal 122 fills voids in the placeholder gate material to provide a better shape for the subsequent gate stack 112. In these examples and others, the gate seal 122 improves the uniformity of the gate stack 112 leading to more reliable device performance and fewer yield-killing defects.

Figure 2A:
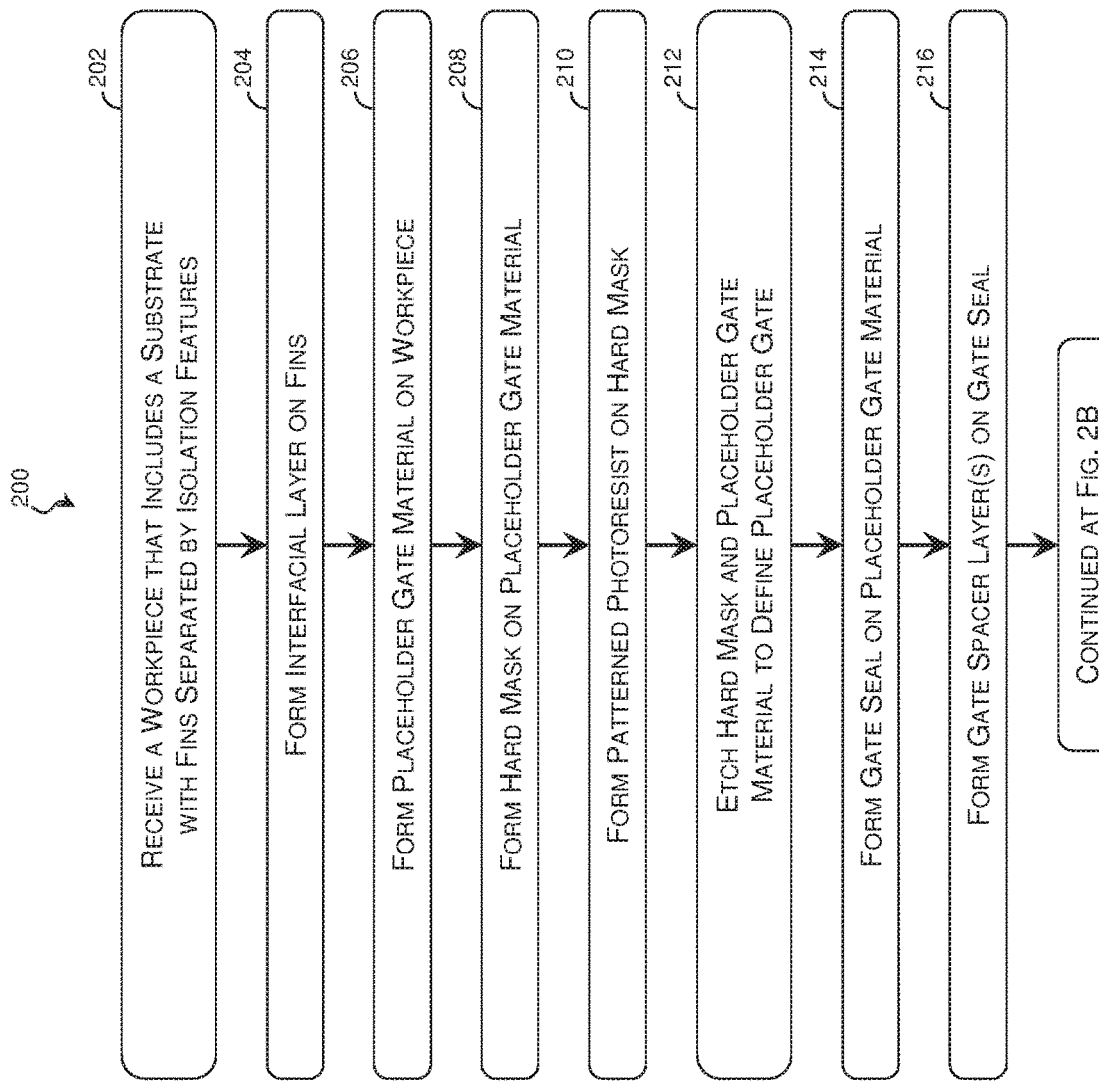

Exemplary methods of forming a workpiece with a gate seal 122, such as the workpiece 100 of FIG. 1, will now be described with reference to FIGS. 2A-15B. In that regard, FIGS. 2A and 2B are flow diagrams of a method 200 of fabricating a workpiece 300 according to some embodiments of the present disclosure. The workpiece 300 may be substantially similar to the workpiece 100 of FIG. 1 in many regards. Additional steps may be provided before, during, and after the method 200, and some of the steps described may be replaced or eliminated for other embodiments of the method 200. FIGS. 3A, 4A, 5A, 6A, 7A, 8A, 9A, 10A, 11A, 12A, 13A, 14A, and 15A are cross-sectional view diagrams of the workpiece 300 taken through a fin 104 at various stages of the method 200 of fabricating the workpiece 300 with a gate seal according to some embodiments of the present disclosure. FIGS. 3B, 4B, 5B, 6B, 7B, 8B, 9B, 10B, 11B, 12B, 13B, 14B, and 15B are cross-sectional view diagrams of the workpiece 300 taken through a non-fin region at various stages of the method 200 of fabricating the workpiece 300 with a gate seal according to some embodiments of the present disclosure. Specifically, the figures show the formation of first and second portions of a single gate stack 112 with a gate seal 122, although it is understood that the gate stack 112 may span multiple fins 104 and that the workpiece 300 may include any number of such gate stacks 112. For clarity, some aspects of the figures have been simplified or omitted.

Referring first to block 202 of FIG. 2A and to FIGS. 3A and 3B, a workpiece 300 is received that includes a substrate 102 with fins 104 extending from it. In various examples, the substrate 102 includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AnnAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 102 may be uniform in composition or may include various layers, some of which may be selectively etched to form the fins. The layers may have similar or different compositions, and in various embodiments, some substrate layers have non-uniform compositions to induce device strain and thereby tune device performance. Examples of layered substrates include silicon-on-insulator (SOI) substrates 102. In some such examples, a layer of the substrate 102 may include an insulator such as a semiconductor oxide, a semiconductor nitride, a semiconductor oxynitride, a semiconductor carbide, and/or other suitable insulator materials.

The fins 104 may be formed by etching into the substrate 102 and/or by depositing (e.g., epitaxially growing) material upon the substrate 102. Accordingly, the fins 104 may include some materials in common with the substrate 102 or may be entirely distinct in composition. In various examples, the fins 104 may include one or more layers of a semiconductor; a dielectric such as a semiconductor oxide, a semiconductor nitride, a semiconductor oxynitride, and/or a semiconductor carbide; and/or other suitable material.

The workpiece 300 may include isolation features 106, such as Shallow Trench Isolation features (STIs), disposed between the fins 104. The isolation features 106 may include a dielectric such as a semiconductor oxide, a semiconductor nitride, a semiconductor carbide, FluoroSilicate Glass (FSG), a low-K dielectric material, and/or other suitable dielectric material. The dielectric material may be deposited by any suitable technique including thermal growth, Chemical Vapor Deposition (CVD), High-Density Plasma CVD (HDP-CVD), Physical Vapor Deposition (PVD), Atomic Layer Deposition (ALD), and/or spin-on techniques. In one such embodiment, a CVD process is used to deposit a flowable dielectric material that includes both a dielectric component and a solvent in a liquid or semiliquid state. A curing process is used to drive off the solvent, leaving behind the dielectric material of the isolation features 106 in its solid state. Referring back to FIG. 1, the isolation features 106 may be recessed such that a portion of each fin extends above the adjacent isolation features 106 while another portion of each fin is below and surrounded by the adjacent isolation features.

As noted above, the workpiece 300 may be fabricated in a gate replacement or a gate-first process. In a gate replacement process, a placeholder gate structure is first formed on the workpiece 300 and subsequently replaced with a functional gate as described in blocks 204-230. This may be done when materials of the functional gate (e.g., gate electrode material, gate dielectric layer material, interfacial layer, etc.) may be damaged by some fabrication processes, such as annealing.

Referring to block 204 of FIG. 2A and to FIGS. 4A and 4B, an interfacial layer 114 is formed on the top and side surfaces of the fins 104. The interfacial layer 114 may include an interfacial material, such as a semiconductor oxide, semiconductor nitride, semiconductor oxynitride, other semiconductor dielectrics, other suitable interfacial materials, and/or combinations thereof. The interfacial layer 114 may be formed to any suitable thickness using any suitable process including thermal growth, ALD, CVD, HDP-CVD, PVD, spin-on deposition, and/or other suitable deposition processes. In some examples, the interfacial layer 114 is formed by a thermal oxidation process and includes a thermal oxide of a semiconductor present in the fins 104 (e.g., silicon oxide for silicon-containing fins 104, silicon-germanium oxide for silicon-germanium-containing fins 104, etc.).

Referring to block 206 of FIG. 2A and to FIGS. 5A and 5B, a placeholder gate material 502 is formed on the workpiece 300. The placeholder gate material 502 may include any suitable material such as a semiconductor and/or a dielectric. The placeholder gate material 502 may be formed using any suitable process including CVD, HDP-CVD, PVD, ALD, spin-on deposition, and/or other suitable deposition processes. In one such example, the placeholder gate material 502 includes polysilicon formed in a Low Pressure CVD (LPCVD) process using a precursor such as $SiH_4$ at a temperature between about 500° C. and about 650° C. and a pressure between about 0.2 Torr and about 1.0 Torr.

Referring to block 208 of FIG. 2A and referring still to FIGS. 5A and 5B, a first hard mask layer 504 may be formed on the placeholder gate material 502 to aid in patterning the placeholder gate material 502. The first hard mask layer 504 may include any suitable material, and in various examples include a dielectric such as a semiconductor oxide, a semiconductor nitride, a semiconductor oxynitride, a semiconductor carbide, etc. In one such example, the first hard mask layer 504 includes silicon nitride. The first hard mask layer 504 may be formed using any suitable process including CVD, HDP-CVD, PVD, ALD, spin-on deposition, and/or other suitable deposition processes.

Referring to block 210 of FIG. 2A and referring still to FIGS. 5A and 5B, a photoresist layer 506 is formed on the placeholder gate material 502 and the first hard mask layer 504 and patterned to define a placeholder gate 508. An exemplary photoresist layer 506 includes a photosensitive material that causes the layer to undergo a property change when exposed to light. This property change can be used to selectively remove exposed or unexposed portions of the photoresist layer in a process referred to as lithographic patterning. In one such embodiment, a photolithographic system exposes the photoresist layer 506 to radiation in a particular pattern determined by a mask. Light passing through or reflecting off the mask strikes the photoresist layer 506 thereby transferring a pattern formed on the mask to the photoresist layer 506. In other such examples, the photoresist layer 506 is patterned using a direct write or maskless lithographic technique, such as laser patterning, e-beam patterning, and/or ion-beam patterning. Once exposed, the photoresist layer 506 is developed leaving the exposed portions of the resist, or in alternative examples, leaving the unexposed portions of the resist. An exemplary patterning process includes soft baking of the photoresist layer 506, mask aligning, exposure, post-exposure baking, developing the photoresist layer 506, rinsing, and drying (e.g., hard baking). The patterned photoresist layer 506 exposes portions of the first hard mask layer 504 and/or the placeholder gate material 502 to be etched.

Referring to block 212 of FIG. 2A and to FIGS. 6A and 6B, the exposed portions of the first hard mask layer 504 and the placeholder gate material 502 are etched to further define the placeholder gate 508. The etching processes may include any suitable etching technique, such as wet etching, dry etching, Reactive Ion Etching (RIE), ashing, and/or other etching methods. In some examples, etching includes multiple etching steps with different etching chemistries, each targeting a particular material of the workpiece 300. In particular, the etching steps and chemistries may be configured to etch the first hard mask layer 504 and the placeholder gate material 502 without significantly etching the fins 104 or the isolation features 106. Any remaining photoresist layer 506 and/or first hard mask layer 504 may be removed from the placeholder gate material 502 after the etching.

Referring to block 214 of FIG. 2A and to FIGS. 7A and 7B, a gate seal 122 is formed on the top and side surfaces of the placeholder gate material 502. The gate seal 122 may include any suitable material, such as a semiconductor and/or dielectric. The gate seal 122 may be formed to any suitable thickness 702 and may be formed using any suitable process including thermal growth, CVD, HDP-CVD, PVD, ALD, High Aspect Ratio Process (HARP) and/or other suitable processes. In some examples, the gate seal 122 is formed by thermal oxidation of the placeholder gate material 502 and accordingly, contains an oxide of a material in the placeholder gate material 502. In some examples, the placeholder gate material 502 includes polysilicon and is heated to a temperature at between about 700° C. and about 1500° C. in an environment containing $O_2$ (dry oxidation), $H_2O$ (wet oxidation), or other oxygen source. In one such example, the process produces a substantially conformal gate seal 122 consisting essentially of polysilicon oxide (poly oxide) or other suitable oxide with a thickness 702 selected to be between about 0.2 nm and about 2 nm. Accordingly, in examples where the placeholder gate material 502 has a thickness of between about 10 nm and about 20 nm and a height of between about 100 nm and 200 nm, the thickness of the gate seal 122 is between about $\frac{1}{100}$ and $\frac{1}{10}$ the thickness of the placeholder gate material 502 and between about $\frac{1}{1,000}$ and about $\frac{1}{100}$ the height of the placeholder gate material 502.

As noted above, the gate seal 122 may be formed using thermal growth, HARP, ALD, CVD, or other suitable processes. The particular process or processes may be selected based on the quality of the interface produced by the process in light of the surface roughness and other surface properties of the placeholder gate material 502. A process may also be selected based on the uniformity of deposition at the bottom of narrow trenches such as the non-fin regions between fins shown in FIG. 7B. Additionally or in the alternative, a deposition process may be selected based on the desired thickness of the gate seal 122. Accordingly, the present disclosure is not limited to any particular technique for forming the gate seal 122. In these examples and others, the gate seal 122 reduces gate extrusion and other defects that may affect device performance or yield.

Referring to block 216 of FIG. 2A and to FIGS. 8A and 8B, one or more gate spacer layers are formed on the gate seal 122 and the isolation feature 106, of which three (an inner spacer layer 802, a middle spacer layer 804, and an outer spacer layer 806) are shown. In various examples, each of the gate spacer layers includes a suitable material, such as: a dielectric material (e.g., a semiconductor oxide, a semiconductor nitride, a semiconductor oxynitride, a semiconductor carbide, a semiconductor oxycarbonitride, etc.), SOG, tetraethylorthosilicate (TEOS), PE-oxide, HARP-formed oxide, and/or other suitable material. The gate spacer layers may be formed to any suitable thickness using any suitable deposition technique (e.g., CVD, HDP-CVD, ALD, etc.). In one such embodiment, the inner spacer layer 802 includes silicon oxycarbonitride, the middle spacer layer 804 includes silicon oxide, and the outer spacer layer 806 includes silicon nitride. In the embodiment, each gate spacer layer has a thickness between about 1 nm and about 10 nm and is deposited by a conformal CVD and/or ALD process.

Referring to block 218 of FIG. 2B and to FIGS. 9A and 9B, the gate spacer layers are selectively etched to remove them from the horizontal surfaces of the placeholder gate material 502, fins 104, and isolation features 106 while leaving them on the vertical surfaces. This defines gate spacers 120 disposed alongside the placeholder gate 508. The etching process may be performed using any suitable etching method, such as wet etching, dry etching, RIE, ashing, and/or other etching methods and may use any suitable etchant chemistries. The etching methods and the etchant chemistries may vary as the gate spacer layers are etched to target the particular material being etched while minimizing unintended etching of the materials not being targeted. In some such examples, the etching process is configured to anisotropically etch the gate spacer layers, while leaving the portions of the gate spacers 120 on the vertical sidewalls of the placeholder gate 508. In some embodiments, the etching process of block 218 is configured to remove the gate seal 122 from the horizontal surface of the placeholder gate material 502 while leaving the gate seal 122 on the vertical surfaces of the placeholder gate material 502.

Referring to block 220 of FIG. 2B and to FIGS. 10A and 10B, an etching process is performed on the workpiece 300 to create recesses 1002 in which to form source/drain features. The etching process may be performed using any suitable etching method, such as wet etching, dry etching, RIE, ashing, and/or other etching methods and may use any suitable etchant chemistries, such as carbon tetrafluoride ($CF_4$), difluoromethane ($CH_2F_2$), trifluoromethane ($CHF_3$), other suitable etchants, and/or combinations thereof. The etching methods and the etchant chemistries may be selected to etch the fins 104 without significant etching of the placeholder gate 508, gate spacers 120, the gate seal 122, and/or the isolation features 106. In some examples, the etching of block 220 is performed as part of block 218.

Referring to block 222 of FIG. 2B and to FIGS. 11A and 11B, an epitaxy process is performed on the workpiece 300 to grow source/drain features 108 within the recesses 1002. In various examples, the epitaxy process includes a CVD deposition technique (e.g., Vapor-Phase Epitaxy (VPE) and/or Ultra-High Vacuum CVD (UHV-CVD)), molecular beam epitaxy, and/or other suitable processes. The epitaxy process may use gaseous and/or liquid precursors, which interact with a component of the substrate 102 (e.g., silicon) to form the source/drain features 108. The resultant source/drain features 108 may be in-situ doped to include p-type dopants, such as boron or $BF_2$; n-type dopants, such as phosphorus or arsenic; and/or other suitable dopants including combinations thereof. Additionally or in the alternative, the source/drain features 108 may be doped using an implantation process (i.e., a junction implant process) after the source/drain features 108 are formed. Once the dopant(s) are introduced, a dopant activation process, such as Rapid Thermal Annealing (RTA) and/or a laser annealing process, may be performed to activate the dopants within the source/drain features 108.

The source/drain features 108 may have any suitable shape, and in some examples, the source/drain features 108 have a substantially u-shaped profile where a vertical sidewall portion of each of the source/drain features 108 is substantially aligned with an outer vertical surface of the gate spacer 120 (e.g., exterior surface of the outer spacer layer 806). Furthermore in some examples, halo/pocket implantation is performed on the substrate 102, and as a result, the source/drain features 108 extend underneath the gate spacers 120.

Figures 12A, 12B:
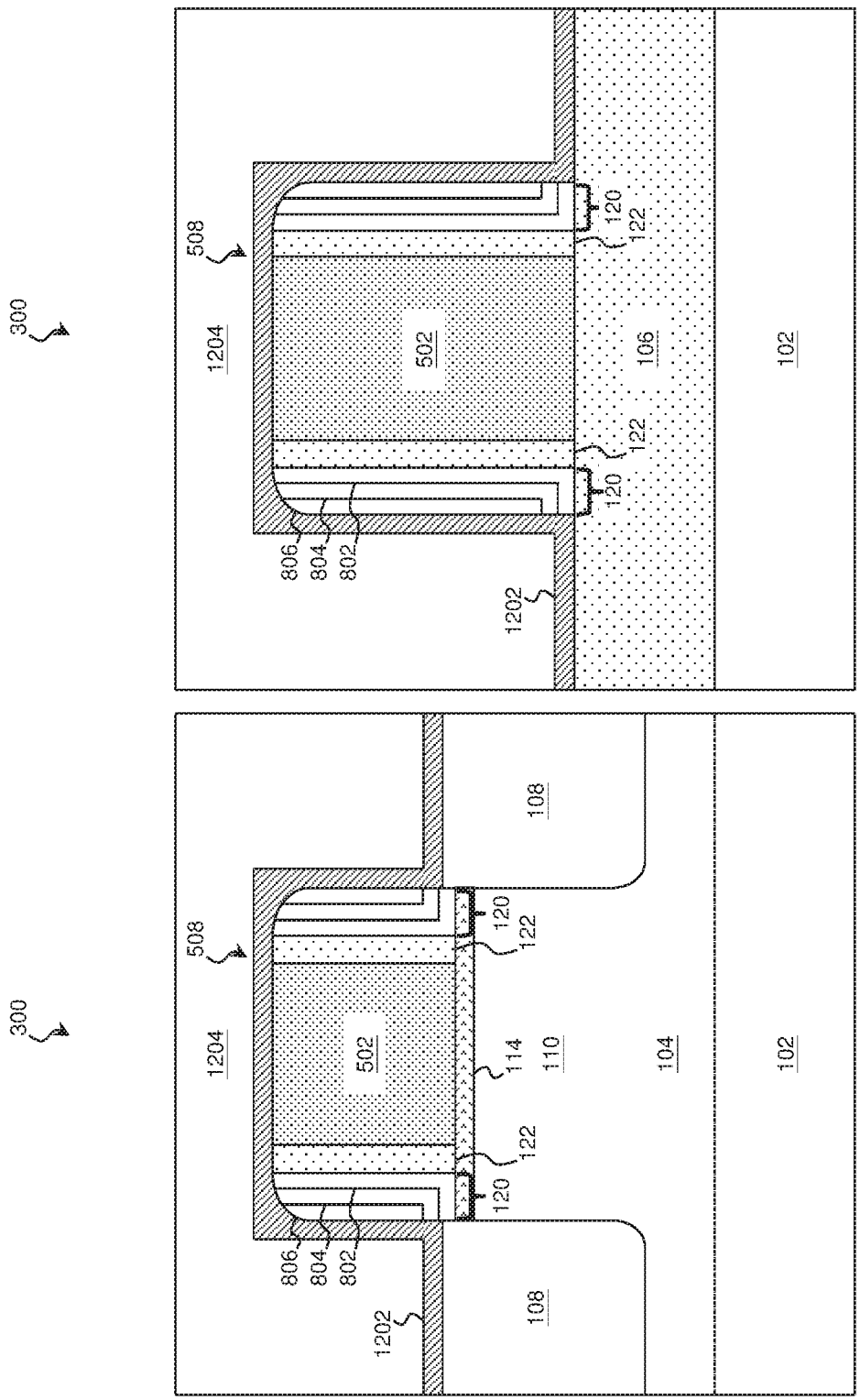

Referring to block 224 of FIG. 2B and to FIGS. 12A and 12B, a Contact Etch Stop Layer (CESL) 1202 is formed on the workpiece 300. The CESL 1202 may be formed on the source/drain features 108 and on the placeholder gate 508, and in particular, on the vertical side surfaces of gate spacer 120. The CESL 1202 may include any suitable material, such as: a dielectric material (e.g., a semiconductor oxide, a semiconductor nitride, a semiconductor oxynitride, a semiconductor carbide, a semiconductor oxycarbonitride, etc.), polysilicon, SOG, TEOS, PE-oxide, HARP-formed oxide, and/or other suitable material. In some examples, the CESL 1202 includes silicon oxycarbonitride. The CESL 1202 may be formed to any suitable thickness using any suitable deposition technique (e.g., CVD, HDP-CVD, ALD, etc.). In some examples, the CESL 1202 has a thickness between about 1 nm and about 10 nm, and is deposited by a conformal CVD and/or ALD process.

Referring to block 226 of FIG. 2B and referring still to FIGS. 12A and 12B, an Inter-Level Dielectric (ILD) layer 1204 is formed on the workpiece 300. The ILD layer 1204 acts as an insulator that supports and isolates conductive traces of an electrical multi-level interconnect structure that electrically interconnects elements of the workpiece 300, such as the source/drain features 108 and the gate stack. The ILD layer 1204 may comprise a dielectric material (e.g., a semiconductor oxide, a semiconductor nitride, a semiconductor oxynitride, a semiconductor carbide, etc.), SOG, fluoride-doped silicate glass (FSG), phosphosilicate glass (PSG), borophosphosilicate glass (BPSG), Black Diamond® (Applied Materials of Santa Clara, Calif.), Xerogel, Aerogel, amorphous fluorinated carbon, parylene, BCB, SILK® (Dow Chemical of Midland, Mich.), and/or combinations thereof. The ILD layer 1204 may be formed by any suitable process including CVD, PVD, spin-on deposition, and/or other suitable processes.

A chemical mechanical polish/planarization (CMP) process is performed on the workpiece 300. The CMP process may remove some or all of the CESL 1202 and the ILD layer 1204 from the top of the placeholder gate material 502, and may be followed by an etch back to remove any remaining material from the placeholder gate material 502.

Referring to block 228 of FIG. 2B and to FIGS. 13A and 13B, the placeholder gate material 502 is removed as part of a gate replacement process to provide a recess 1302 between the gate seal 122 and between the gate spacers 120. Removing the placeholder gate material 502 may include one or more etching processes (e.g., wet etching, dry etching, RIE) using an etchant chemistry configured to selectively etch the placeholder gate material 502 without significant etching of surrounding materials such as the gate seal 122, the fin 104, the gate spacer layers, the CESL 1202, the ILD layer 1204, etc.

Figures 14A, 14B:
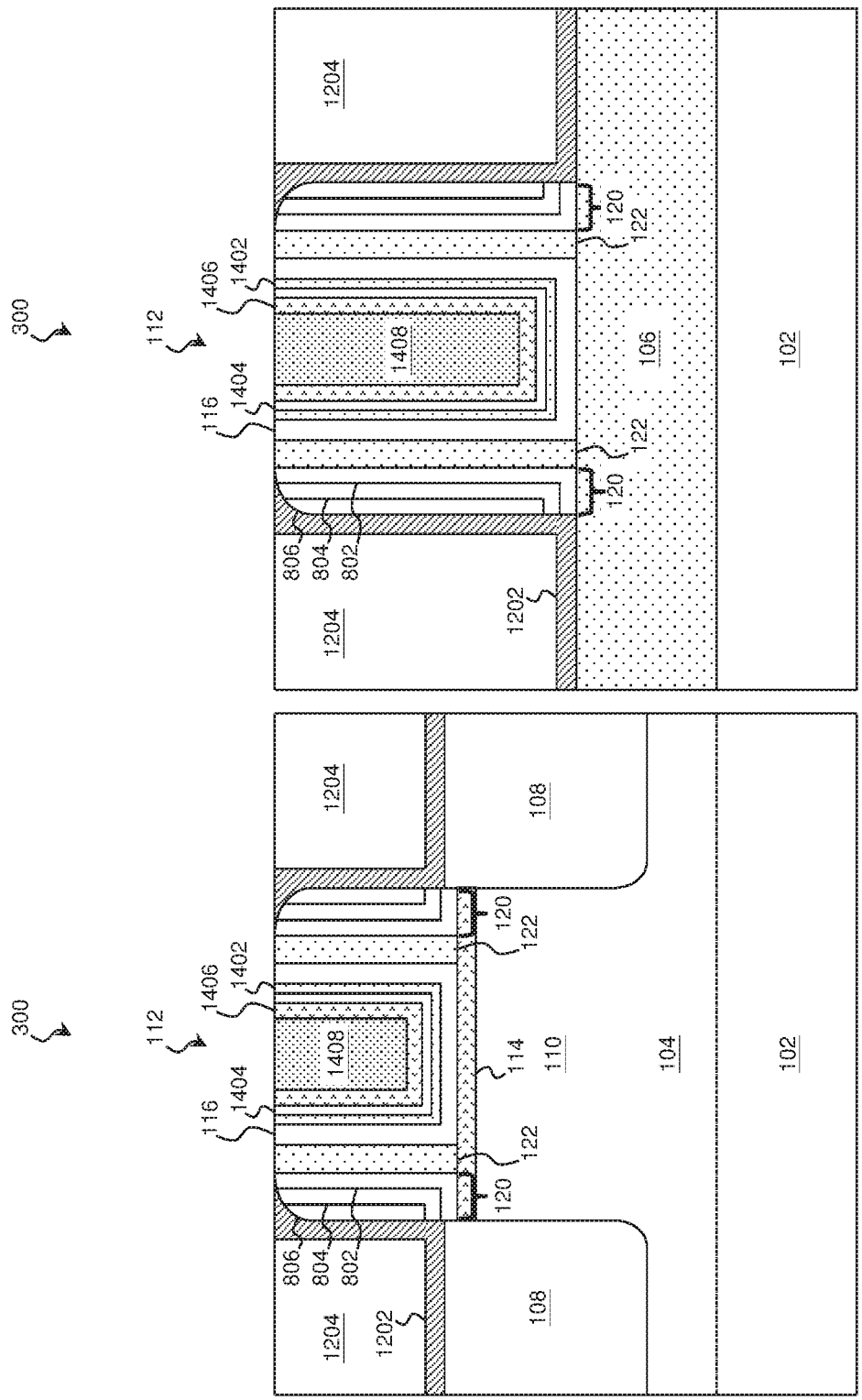

Referring to block 230 of FIG. 2B and to FIGS. 14A and 14B, a functional gate stack 112 is formed in the recess 1302 defined by removing the placeholder gate material 502. In some example, this includes depositing a gate dielectric 116 on the interfacial layer 114 and along at least some of the vertical surfaces of the gate seal 122. The gate dielectric 116 may include one or more dielectric materials, which are commonly characterized by their dielectric constant relative to silicon dioxide. In some embodiments, the gate dielectric 116 includes a high-k dielectric material, such as $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. Additionally or in the alternative, the gate dielectric 116 may include other dielectrics, such as a semiconductor oxide, semiconductor nitride, semiconductor oxynitride, semiconductor carbide, amorphous carbon, TEOS, other suitable dielectric material, and/or combinations thereof. The gate dielectric 116 may be formed to any suitable thickness using any suitable process including ALD, CVD, HDP-CVD, PVD, spin-on deposition, and/or other suitable deposition processes.

The gate stack 112 may also include a gate electrode disposed on and within the gate dielectric 116 that, in turn, includes layers such as a capping layer 1402, a barrier layer 1404, one or more work function layer(s) 1406, an electrode fill 1408, etc.

Referring first to the capping layer 1402, the capping layer 1402 may be formed on the horizontal and vertical surfaces of the gate dielectric 116 in block 230. The capping layer 1402 may include any suitable conductive material including metals (e.g., W, Al, Ta, Ti, Ni, Cu, Co, etc.), metal nitrides, and/or metal silicon nitrides, and may be deposited via CVD, ALD, PE CVD, PEALD, PVD, and/or other suitable deposition process. In various embodiments, the capping layer 1402 includes TaSiN, TaN, or TiN.

A barrier layer 1404 may be formed on the horizontal and vertical surfaces of the capping layer 1402 in block 230. The barrier layer 1404 may contain any suitable material, such as W, Ti, TiN, Ru, or combinations thereof. Materials for the barrier layer 1404 may be selected based on their resilience to diffusion into the capping layer 1402. The barrier layer 1404 may be deposited by any suitable technique including ALD, CVD, PE CVD, PEALD, PVD (e.g., sputtering), and/or combinations thereof.

One or more work function layer(s) 1406 are formed on the horizontal and vertical surfaces of the capping layer 1402 in block 230. Suitable work function layer 1406 materials include n-type and/or p-type work function materials based on the type of device to which the gate stack 112 corresponds. Exemplary p-type work function metals include TiN, TaN, Ru, Mo, Al, WN, $ZrSi_2$, $MoSi_2$, $TaSi_2$, $NiSi_2$, WN, other suitable p-type work function materials, and/or combinations thereof. Exemplary n-type work function metals include Ti, Ag, TaAl, TaAlC, TiAlN, TaC, TaCN, TaSiN, Mn, Zr, other suitable n-type work function materials, and/or combinations thereof. The work function layer(s) 1406 may be deposited by any suitable technique including ALD, CVD, PE CVD, PEALD, PVD, and/or combinations thereof.

Finally, an electrode fill 1408 is formed on the work function layer(s) in block 230. The electrode fill 1408 may include any suitable material including metals (e.g., W, Al, Ta, Ti, Ni, Cu, Co, etc.), metal oxides, metal nitrides and/or combinations thereof, and in an example, the electrode core includes tungsten (W). The electrode fill 1408 may be deposited by any suitable technique including ALD, CVD, PE CVD, PEALD, PVD, and/or combinations thereof.

Referring to block 232 of FIG. 2B, the workpiece may be provided for further fabrication. In some embodiments, this includes forming a self-aligned capping feature 1502 on the gate stack 112. The self-aligned capping feature 1502 may aid in contact formation by electrically isolating the gate stack 112 from a misaligned contact that partially overlaps the gate stack 112. Accordingly, the self-aligned capping feature 1502 may include a dielectric or other suitable insulating material and in an embodiment includes silicon oxynitride. In one such example, the layers of the gate stack 112 including the gate dielectric 116, the capping layer 1402, the barrier layer 1404, the work function layers 1406, and the electrode fill 1408 are partially recessed using one or more etching techniques and etchants configured to etch the materials of the gate stack without significant etching of the gate seal 122 and/or the ILD layer 1204. The self-aligned capping feature 1502 is deposited in the recess via CVD, PE CVD, ALD, PEALD, PVD and/or other suitable deposition process, and a CMP process is performed such that a top surface of the self-aligned capping feature 1502 is substantially coplanar with a top surface of the ILD layer 1204, the CESL 1202, the gate spacer 120, and/or the gate seal 122.

Thus, the present disclosure provides examples of a circuit device that includes a gate stack and a gate seal. In some examples, a method includes receiving a substrate having a fin extending from the substrate. A placeholder gate is formed on the fin, and first and second gate seals are formed on sides of the placeholder gate. The placeholder gate is selectively removed to form a recess between side surfaces of the first gate seal and the second gate seal. A functional gate is formed within the recess and between the side surfaces of the first gate seal and the second gate seal. In some such examples, the forming of the first gate seal and the second gate seal includes performing a thermal oxidation process on a material of the placeholder gate. In some such examples, the material of the placeholder gate includes polysilicon and the gate seal includes polysilicon oxide. In some such examples, the forming of the functional gate includes forming a gate dielectric within the recess, and the gate dielectric physically contacts an entirety of the side surfaces of the first gate seal and the second gate seal. In some such examples, the forming of the placeholder gate further forms the placeholder gate on an isolation feature disposed adjacent the fin, and the forming of the first gate seal forms the first gate seal on a first portion of the placeholder gate disposed on the fin and on a second portion of the placeholder gate disposed on the isolation feature. In some such examples, an interfacial layer is formed on the fin, and the placeholder gate is formed on the interfacial layer. In some such examples, the first gate seal and the second gate seal are formed on the interfacial layer. In some such examples, a sidewall spacer is formed alongside the first gate seal, and the sidewall spacer physically contacts the first gate seal. In some such examples, a dielectric layer is formed on functional gate. The dielectric layer extends between the side surfaces of the first gate seal and the second gate seal.

In further examples, a method includes receiving a substrate having a channel region. A placeholder gate is formed on the channel region, and the placeholder gate is oxidized to form dielectric gate seals on the placeholder gate. A gate spacer is formed on the dielectric gate seals. The placeholder gate is replaced with a functional gate such that the functional gate is disposed between the dielectric gate seals. In some such examples, the placeholder gate includes polysilicon and the dielectric gate seals includes polysilicon oxide. In some such examples, the functional gate includes a gate dielectric and the gate dielectric physically contacts the dielectric gate seals. In some such examples, the gate dielectric extends along an entire vertical surface of each of the dielectric gate seals. In some such examples, the substrate includes an isolation feature, and the dielectric gate seals are on the channel region and on the isolation feature. In some such examples, the functional gate is on the channel region and the isolation feature, and the replacing of the placeholder gate is such that a first portion of the functional gate on the channel region and a second portion of the functional gate on the isolation feature are disposed between the dielectric gate seals.

In yet further examples, a device includes: a pair of source/drain regions, a channel region disposed between the pair of source/drain regions, a gate stack disposed on the channel region, and a gate seal disposed on a side surface of the gate stack. In some such examples, the gate seal includes a dielectric material. In some such examples, wherein the gate seal consists essentially of polysilicon oxide. In some such examples, the device includes a gate spacer disposed on another side surface of the gate seal opposite the gate stack such that the gate spacer physically contacts the gate seal. In some such examples, the device includes an interfacial layer disposed on the channel region, and the gate stack and the gate seal are disposed on the interfacial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   receiving a substrate having a fin extending from the substrate;
   forming an interfacial layer over a top surface of the fin;
   forming a placeholder gate on the interfacial layer;
   forming a first gate seal on a first side surface of the placeholder gate and a second gate seal on a second side surface of the placeholder gate, wherein the forming of the first gate seal and the second gate seal includes growing the first gate seal and the second gate seal on the first side surface and the second side surface of the placeholder gate, respectively;
   forming a sidewall spacer along and in direct contact with a side surface of each of the first gate seal and the second gate seal, wherein the first gate seal, the second gate seal, and each sidewall spacer physically contact a top surface of the interfacial layer;
   selectively removing the placeholder gate to form a recess between side surfaces of the first gate seal and the second gate seal; and
   forming a functional gate within the recess and between the side surfaces of the first gate seal and the second gate seal.

2. The method of claim 1, wherein the selective growing of the first gate seal and the second gate seal includes performing a thermal oxidation process on a material of the placeholder gate.

3. The method of claim 2, wherein the material of the placeholder gate includes polysilicon and the first gate seal and the second gate seal include polysilicon oxide.

4. The method of claim 1, wherein the forming of the functional gate includes forming a gate dielectric within the recess, and wherein the gate dielectric physically contacts an entirety of the side surfaces of the first gate seal and the second gate seal.

5. The method of claim 1, wherein the forming of the placeholder gate further forms the placeholder gate on an isolation feature disposed adjacent the fin, and wherein the forming of the first gate seal forms the first gate seal on a first portion of the placeholder gate disposed on the fin and on a second portion of the placeholder gate disposed on the isolation feature.

6. The method of claim 1 further comprising:
   forming a dielectric layer on the functional gate, wherein the dielectric layer extends between the side surfaces of the first gate seal and the second gate seal.

7. The method of claim 1, wherein the forming of the first gate seal and the second gate seal forms a dielectric layer on a top surface of the placeholder gate, and wherein the forming of the sidewall spacer removes the dielectric layer to expose the top surface of the placeholder gate.

8. The method of claim 1, wherein the forming of the sidewall spacer removes portions of the interfacial layer to expose the top surface of the fin.

9. The method of claim 1, wherein the forming of the sidewall spacer includes:
   depositing a spacer layer over the first gate seal and the second gate seal, wherein horizontal portions of the spacer layer are deposited to physically contact the interfacial layer; and
   removing the horizontal portions of the spacer layer to form each sidewall spacer.

10. A method comprising:
    receiving a substrate having a channel region defined therein;
    forming an interfacial layer on the channel region;
    forming a placeholder gate on the interfacial layer;

oxidizing the placeholder gate to form dielectric gate seals along side surfaces of the placeholder gate;
forming gate spacers along and in direct contact with the dielectric gate seals, wherein the interfacial layer laterally extends to define bottom surfaces of both the dielectric gate seals and the gate spacers; and
replacing the placeholder gate with a functional gate such that the functional gate is disposed between the dielectric gate seals.

11. The method of claim 10, wherein the placeholder gate includes polysilicon and the dielectric gate seals includes polysilicon oxide.

12. The method of claim 10, wherein the functional gate includes a gate dielectric and wherein the gate dielectric physically contacts the dielectric gate seals.

13. The method of claim 12, wherein the gate dielectric extends along an entire vertical surface of each of the dielectric gate seals.

14. The method of claim 10, wherein:
the substrate includes an isolation feature; and
the dielectric gate seals are on the channel region and on the isolation feature.

15. The method of claim 14, wherein:
the functional gate is on the channel region and the isolation feature; and
the replacing of the placeholder gate is such that a first portion of the functional gate on the channel region and a second portion of the functional gate on the isolation feature are disposed between the dielectric gate seals.

16. A method, comprising:
forming a fin protruding from a semiconductor substrate;
forming a first oxide layer along a top surface of the fin;
forming a placeholder gate over a portion of the first oxide layer;
oxidizing vertical surfaces of the placeholder gate to form a second oxide layer;
forming gate spacers over the second oxide layer, wherein the gate spacers are in direct contact with a vertical surface of the second oxide layer, and wherein the forming of the gate spacers leaves a portion of the first oxide layer below bottom surfaces of the second oxide layer and the gate spacers; and
replacing the placeholder gate with a functional gate stack, such that sidewalls of the functional gate stack are defined by the second oxide layer.

17. The method of claim 16, wherein the forming of the first oxide layer includes oxidizing the top surface of the fin.

18. The method of claim 16, wherein the first oxide layer and the second oxide layer both include silicon oxide.

19. The method of claim 16, wherein the oxidizing of the vertical surfaces of the placeholder gate oxidizes a top surface of the placeholder gate to form a third oxide layer, and wherein the forming of the gate spacers removes the third oxide layer.

20. The method of claim 16, wherein the forming of the gate spacers includes:
depositing a gate spacer layer over the first oxide layer and the second oxide layer; and
anisotropically etching the gate spacer layer to form the gate spacers, wherein the anisotropical etching of the gate spacer layer removes portions of the first oxide layer to expose the top surface of the fin.

* * * * *